US007447065B2

(12) United States Patent
Fong et al.

(10) Patent No.: US 7,447,065 B2
(45) Date of Patent: Nov. 4, 2008

(54) REDUCING READ DISTURB FOR NON-VOLATILE STORAGE

(75) Inventors: Yupin Fong, Fremont, CA (US); Jun Wan, Sunnyvale, CA (US); Jeffrey Lutze, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/021,741

(22) Filed: Jan. 29, 2008

(65) Prior Publication Data

US 2008/0137424 A1 Jun. 12, 2008

Related U.S. Application Data

(62) Division of application No. 11/295,776, filed on Dec. 6, 2005, now Pat. No. 7,349,258.

(51) Int. Cl.
G11C 11/34 (2006.01)
(52) U.S. Cl. .............. 365/185.02; 365/185.24; 365/185.01; 365/185.26; 365/185.18; 365/185.17; 365/185.25
(58) Field of Classification Search ............ 365/185.02, 365/185.24, 185.01, 185.26, 185.18, 185.17, 365/185.25
See application file for complete search history.

(56) References Cited

U.S. PATENT DOCUMENTS

| 5,101,378 | A |   | 3/1992  | Radjy et al.             |
|-----------|---|---|---------|--------------------------|
| 5,218,686 | A | * | 6/1993  | Thayer ............ 711/100 |
| 5,388,247 | A | * | 2/1995  | Goodwin et al. ..... 711/143 |
| 5,449,947 | A |   | 9/1995  | Chen et al.              |
| 5,581,504 | A |   | 12/1996 | Chang                    |
| 5,586,294 | A | * | 12/1996 | Goodwin et al. ..... 711/137 |
| 5,668,971 | A | * | 9/1997  | Neufeld ............ 711/111 |
| 5,764,572 | A |   | 6/1998  | Hammick                  |
| 5,867,429 | A |   | 2/1999  | Chen et al.              |
| 5,898,615 | A |   | 4/1999  | Chida                    |
| 5,917,766 | A |   | 6/1999  | Tsuji et al.             |
| 6,046,935 | A |   | 4/2000  | Takeuchi et al.          |
| 6,061,280 | A |   | 5/2000  | Aritome                  |
| 6,154,391 | A |   | 11/2000 | Takeuchi et al.          |

(Continued)

FOREIGN PATENT DOCUMENTS

EP          1172822           1/2002

(Continued)

OTHER PUBLICATIONS

U.S. Appl. No. 12/021,729, filed Jan. 29, 2008.

(Continued)

*Primary Examiner*—Viet Q Nguyen
(74) *Attorney, Agent, or Firm*—Vierra Magen Marcus & DeNiro LLP

(57) ABSTRACT

A system is disclosed for reducing or removing a form of read disturb in a non-volatile storage device. One embodiment seeks to prevent read disturb by eliminating or minimizing boosting of the channel of the memory elements. For example, one implementation prevents or reduces boosting of the source side of the NAND string channel during a read process. Because the source side of the NAND string channel is not boosted, at least one form of read disturb is minimized or does not occur.

20 Claims, 11 Drawing Sheets

U.S. PATENT DOCUMENTS

| | | | |
|---|---|---|---|
| 6,175,522 B1 | 1/2001 | Fang | |
| 6,222,762 B1 | 4/2001 | Guterman et al. | |
| 6,240,016 B1 | 5/2001 | Haddad et al. | |
| 6,380,033 B1 | 4/2002 | He et al. | |
| 6,449,685 B1 * | 9/2002 | Leung | 711/106 |
| 6,456,528 B1 | 9/2002 | Chen | |
| 6,522,580 B2 | 2/2003 | Chen et al. | |
| 6,522,583 B2 | 2/2003 | Kanda et al. | |
| 6,535,423 B2 | 3/2003 | Trivedi et al. | |
| 6,542,407 B1 * | 4/2003 | Chen et al. | 365/185.17 |
| 6,570,785 B1 * | 5/2003 | Mangan et al. | 365/185.02 |
| 6,577,533 B2 * | 6/2003 | Sakui et al. | 365/185.05 |
| 6,614,070 B1 | 9/2003 | Hirose et al. | |
| 6,643,188 B2 | 11/2003 | Tanaka et al. | |
| 6,657,891 B1 | 12/2003 | Shibata et al. | |
| 6,707,714 B2 | 3/2004 | Kawamura | |
| 6,717,847 B2 | 4/2004 | Chen | |
| 6,771,536 B2 | 8/2004 | Li et al. | |
| 6,781,877 B2 | 8/2004 | Cernea et al. | |
| 6,807,095 B2 | 10/2004 | Chen et al. | |
| 6,819,592 B2 | 11/2004 | Noguchi et al. | |
| 6,879,520 B2 | 4/2005 | Hosono et al. | |
| 6,891,753 B2 | 5/2005 | Cernea | |
| 6,925,009 B2 | 8/2005 | Noguchi et al. | |
| 6,983,428 B2 | 1/2006 | Cernea | |
| 6,987,693 B2 | 1/2006 | Cernea et al. | |
| 6,996,003 B2 | 2/2006 | Li et al. | |
| 7,006,379 B2 | 2/2006 | Noguchi et al. | |
| 7,009,881 B2 | 3/2006 | Noguchi | |
| 7,023,733 B2 | 4/2006 | Guterman et al. | |
| 7,023,736 B2 | 4/2006 | Cernea et al. | |
| 7,023,739 B2 | 4/2006 | Chen et al. | |
| 7,046,568 B2 | 5/2006 | Cernea | |
| 7,177,191 B2 | 2/2007 | Fasoli et al. | |
| 7,196,931 B2 | 3/2007 | Cernea et al. | |
| 7,262,994 B2 * | 8/2007 | Fong et al. | 365/185.17 |
| 7,295,473 B2 * | 11/2007 | Fong et al. | 365/185.17 |
| 7,349,258 B2 * | 3/2008 | Fong et al. | 365/185.18 |
| 2004/0057318 A1 | 3/2004 | Cernea et al. | |
| 2005/0036369 A1 | 2/2005 | Lee et al. | |
| 2005/0169082 A1 | 8/2005 | Cernea | |

FOREIGN PATENT DOCUMENTS

| | | | |
|---|---|---|---|
| EP | 1341185 | | 9/2003 |
| JP | 362140294 | | 6/1987 |
| JP | 362140294 A | * | 6/1987 |
| JP | 363171495 A | * | 7/1988 |
| JP | 406309891 A | * | 11/1994 |
| JP | 2003217288 | | 7/2003 |
| JP | 2004030866 | | 1/2004 |

OTHER PUBLICATIONS

U.S. Appl. No. 12/021,761, filed Jan. 29, 2008.
International Preliminary Report on Patentability dated Jun. 19, 2008 in PCT Application No. PCT/US2006/046126.

* cited by examiner

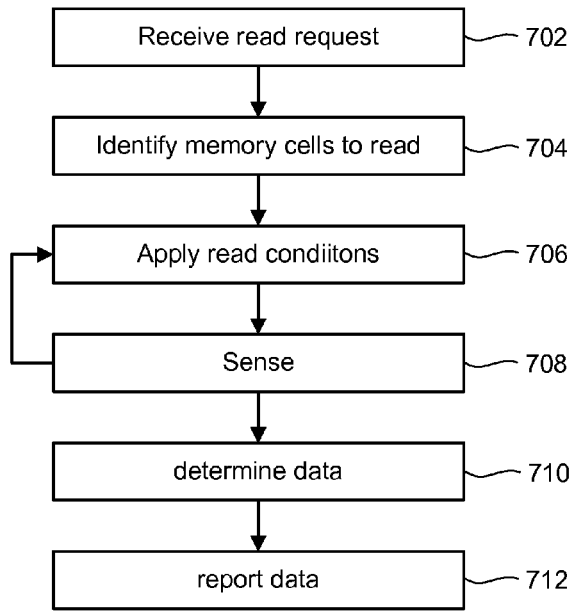
Fig. 13
Fig. 14
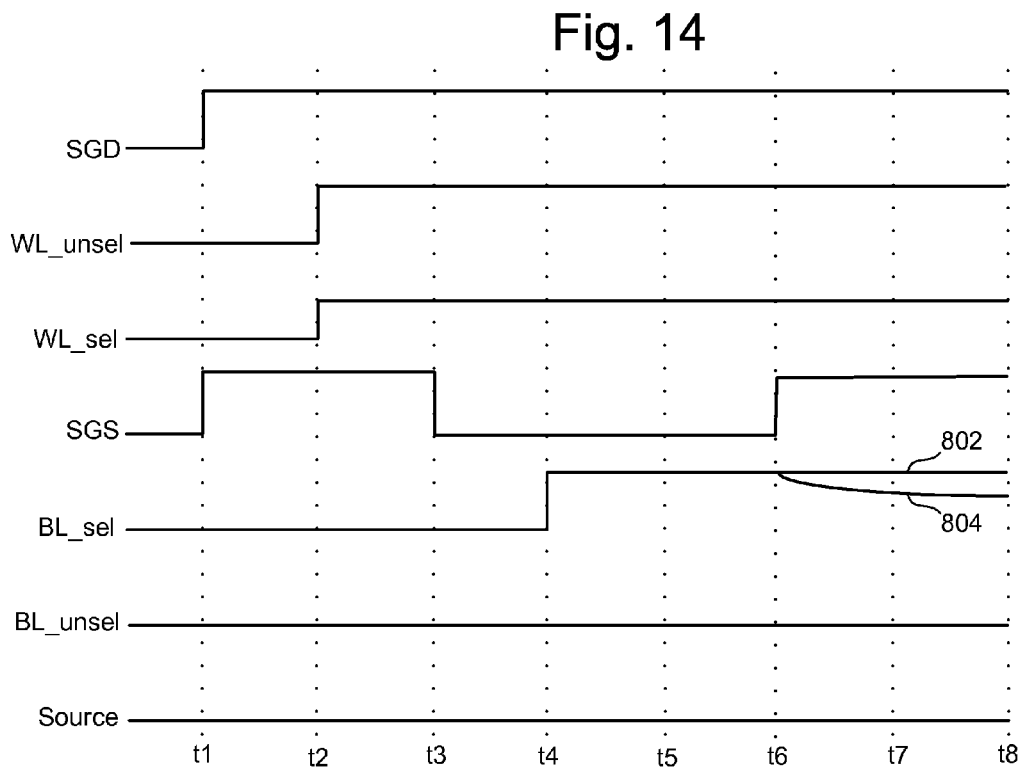

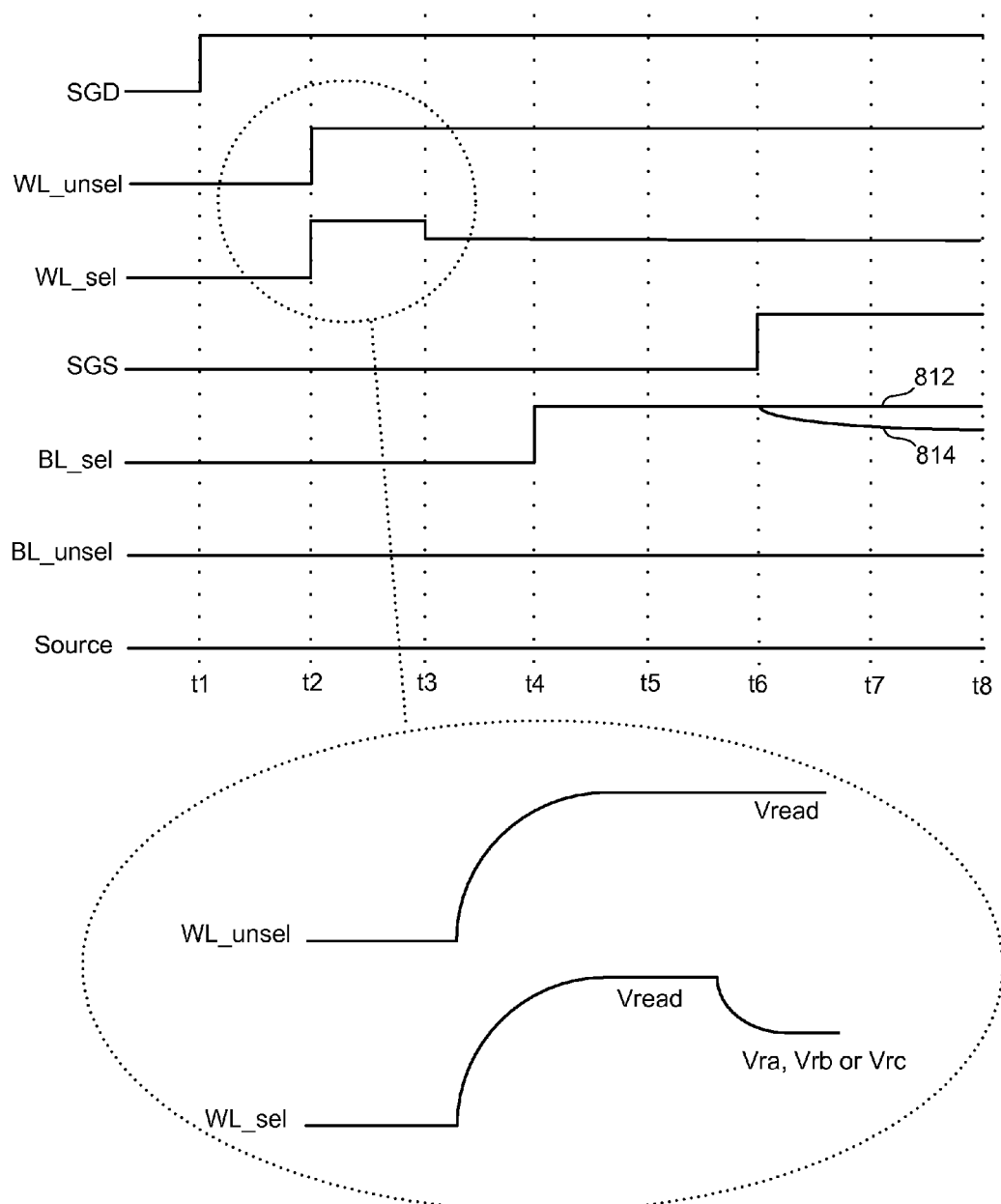

US 7,447,065 B2

REDUCING READ DISTURB FOR NON-VOLATILE STORAGE

CLAIM OF PRIORITY

This application is a divisional application of U.S. patent application Ser. No. 11/295,776, entitled "REDUCING READ DISTURB FOR NON-VOLATILE STORAGE," filed Dec. 6, 2005, incorporated herein by reference.

CROSS REFERENCE

This application is related to the following applications:

U.S. patent application Ser. No. 11/296,087, titled "System for Reducing Read Disturb for Non-Volatile Storage," filed Dec. 6, 2005, U.S. patent application Ser. No. 11/681,188, titled "System For Reducing Read Disturb For Non-Volatile Storage," filed Mar. 2, 2007, U.S. patent application Ser. No. 12/021,729, titled "Reducing Read Disturb For Non-Volatile Storage," filed the same day as the present application, and U.S. patent application Ser. No. 12/021,761, titled "Reducing Read Disturb For Non-Volatile Storage," filed the same day as the present application.

Each of these related applications are incorporated herein by reference in its entirety.

BACKGROUND OF THE INVENTION

1. Field of the Invention

The technology described herein relates to non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397 and in U.S. Pat. No. 6,917,542; both of which are incorporated herein by reference in their entirety.

Typically, the program voltage applied to the control gate is applied as a series of pulses. The magnitude of the pulses is increased with each pulse by a predetermined step size. In the periods between the pulses, verify operations are carried out. That is the programming level of each cell being programmed in parallel is read between each programming pulse to determine whether it is equal to or greater than a verify level to which it is being programmed. One means of verifying the programming is to test conduction at a specific compare point.

Conduction represents an "on" state of the device corresponding to the flow of current across the channel of the device. An "off" state corresponds to no current flowing across the channel between the source and drain. Typically, a flash memory cell will conduct if the voltage being applied to the control gate is greater than the threshold voltage and the memory cell will not conduct if the voltage applied to the control gate is less than the threshold voltage. By setting the threshold voltage of the memory cell to an appropriate value, the memory cell can be made to either conduct or not conduct current for a given set of applied voltages. Thus, by determining whether a memory cell conducts current at a given set of applied voltages, the state of the memory cell can be determined.

Flash memory cells are erased by raising the p-well to an erase voltage (e.g. 20 volts) and grounding the word lines of a selected block (or other unit) of memory cells. The source and bit lines are floating. Erasing can be performed on the entire memory array, separate blocks, or another unit of cells. Electrons are transferred from the floating gate to the p-well region and the threshold voltage becomes negative.

One example of a non-volatile memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 connects the NAND string to bit line contact 126. Select gate 122 connects the NAND string to source line contact 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD. Select gate 122 is connected to select line SGS.

FIG. 3 provides a cross-sectional view of the NAND string described above. As depicted in FIG. 3, the transistors of the NAND string are formed in p-well region 140. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1-3 show four memory cells in the NAND string, the use of four transistors is provided only as an example. A NAND string used with the technology described herein can have less than four memory cells or more than four memory cells. For example, some NAND strings will include 8 memory cells, 16 memory cells, 32 memory cells, 64 memory cells, etc. The discussion herein is not limited to any particular number of memory cells in a NAND string.

Each memory cell can store data represented in analog or digital form. When storing one bit of digital data, the range of possible threshold voltages of the memory cell can be divided into two ranges, which are assigned logical data "1" and "0." In one example of a NAND flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states (known as a multi-state memory cell), thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Relevant examples of NAND-type flash memories and their operation are provided in the following U.S. patents/patent Applications, all of which are incorporated herein by reference in their entirety: U.S. Pat. Nos. 5,570,315; 5,774, 397; 6,046,935; 5,386,422; 6,456,528; and U.S. patent application Ser. No. 09/893,277 (Publication No. US2003/0002348).

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

A typical architecture for a flash memory system using a NAND structure will include several NAND strings. For example, FIG. 4 shows three NAND strings 202, 204 and 206 of a memory array having many more NAND strings. Each of the NAND strings of FIG. 4 includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array of memory cells.

In typical read and verify operations for NAND flash memory, the select gates (SGD and SGS) are raised to approximately 3 volts and the unselected word lines are raised to a read pass voltage (e.g. 5 volts) to make the transistors operate as pass gates. The selected word line is connected to a voltage, a level of which is specified for each read and verify operation in order to determine whether a threshold voltage of the concerned memory cell has reached such level. For example, in a read operation for memory cell 244, assuming a two level memory, the selected word line WL2 may be grounded so that it is detected whether the threshold voltage is higher than 0V and the unselected word lines WL0, WL1 and WL3 are at 5 volts. In a verify operation, the selected word line WL2 is connected to 1V, for example, so that it is verified whether the threshold voltage has reached at least 1V. The source and p-well are at zero volts. The selected bit lines are pre-charged to a level of, for example, 0.7V. If the threshold voltage is higher than the verify or read level applied to the selected word line, the potential level of the concerned bit line maintains the high level because of the non-conductive memory cell. On the other hand, if the threshold voltage is lower than the read or verify level, the potential level of the concerned bit line decreases to a low level, for example less than 0.5V, because of the conductive memory cell. The state of the memory cell is detected by a sense amplifier that is connected to the bit line.

FIG. 5 is a timing diagram that depicts the behavior of various signals during a read operation. Initially, all of the depicted signals are low. At time t1, the gate voltage (SGD) for the drain side select gate is raised to 1.5 to 4.5 volts to turn on the drain side select gate. It is assumed, in this example, that memory cell 244 is being read. The bit line BL_sel selected for reading (e.g., bit line for NAND string 204) is initially at zero volts. The unselected bit lines BL_unsel (e.g., bit lines for NAND strings 202 and 206) are set to zero volts. At time t2, the unselected word lines WL_unsel (e.g., WL0, WL1 and WL3) are raised to the read pass voltage (Vread) and the selected word line L_sel is raised to the read compare voltage (e.g., a voltage value to determine a read level or a verify level). At time t4, the selected bit line BL_sel is raised to a pre-charge value (e.g., 0.7 volts). At time t6, the gate of the source side select gate receive a voltage SGS of 1.5 to 4.5 volts so that the source side select gate will turn on, providing a path to ground. If the voltage applied on the selected word line WL_sel is greater than the threshold voltage of memory cell 244, the voltage on the bit line BL_sel will be dissipated via the source line. If the voltage applied on the selected word line WL_sel is not greater than the threshold voltage of memory cell 244, the voltage on the bit line BL_sel will be maintained. A sense amplifier is used to sense whether the bit line voltage was maintained or dissipated.

If the selected memory cell being read is in a programmed state, then the selected memory cell may not turn on during the process of ramping the word line to the read compare voltage. If the selected memory cell does not turn on while the ramping the selected word line to the read compare voltage, then as the unselected word lines ramp up to the read pass voltage (Vread), the source side (relative to the selected memory cell on the selected and unselected bit lines) of the NAND string channel is boosted up. Prior to turning on the source side select gate for the read/sensing operation, this boosted channel can result in hot electron injection in the region between the unselected memory cell (source side neighbor) and the selected memory cell, which over time may cause electrons to be injected into the floating gate of the memory cell that is the source side neighbor to the selected memory cell, thereby, raising the threshold voltage of that the source side neighbor. Experiments have shown that if the memory cells experienced many read operations (e.g., 100,000 or more) without a program or erase operation, the threshold voltage will increase over time. This behavior is called Read Disturb. In the above example of reading memory cell 244, memory cells along word line WL1 may experience this type of Read Disturb. This behavior can occur on the selected and unselected bit lines, but is worse on the unselected bit lines. This phenomenon is likely to be linked to the shrinking size of the flash memory devices.

Similarly, if turning on the drain side select gate is used to trigger a reading of the memory cell, rather than SGS, then the drain side of the NAND string channel will be boosted and can cause Read Disturb on the drain side neighbor to the selected memory cell.

There are some applications that may need to be able to perform many read operations without performing an intervening program or erase operation. For example, there are computing devices that use flash memory to store BIOS code. In some cases, the BIOS code is programmed once and then read many times at power-up and/or reset. Thus, the BIOS code may be subject to Read Disturb.

Additionally, some handheld computing devices and mobile telephones use flash memory to store operating system code. This code is typically written once and read many times. It is common for these devices to read the operating system code each time the device turns on. In some cases, the device (the entire device, the processor, or the memory system) may turn off after a predetermined amount of inactivity in order to minimize battery usage. When the device is used again, the relevant components power back on and the operating system code is read again. Thus, it is possible that for a frequently used device (e.g. used for a business), the operating system code is read many times a day. If the device is used long enough, the memory storing the operating system code may be subject to errors due to Read Disturb, causing the operating system code to be corrupted.

Additionally, flash memory is being used with trusted memory cards that require reading keys for authentication. Such devices typically write a key once and then read that key many times. If the card is used long enough, the memory storing the key may be subject to errors due to Read Disturb, causing the key to be corrupted.

Some previously implemented attempts to avoid Read Disturb include using ECC to correct errors, periodically refresh the data by performing a programming operation or periodically re-writing the data to another location. These solutions, however, may require extra hardware or may negatively impact performance.

SUMMARY OF THE INVENTION

The technology described herein pertains to a system for reducing or removing Read Disturb in a storage device. One embodiment seeks to prevent Read Disturb by eliminating or minimizing boosting of the channel of the memory elements. For example, one implementation prevents or reduces boosting of the source side of the NAND string channel during a read process. Because the source side of the NAND string channel is not boosted, the hot electron injection described above does not occur. In embodiments that turn on the drain side select gate to trigger a reading of the memory cell, the technology described herein can be used to prevent or reduce boosting of the drain side of the NAND string channel during a read process.

One embodiment includes setting up read conditions for a group of non-volatile storage elements, preventing boosting of the non-volatile storage elements while setting up the read conditions, and determining data for at least one of the non-volatile storage elements by sensing dissipation of a charge associated with the non-volatile storage elements during the read conditions. The process for reading data described herein can be used as part of a read operation or as part of a verify operation during a programming process.

Another embodiment includes turning on a first select gate for a NAND string, applying one or more read pass voltages to unselected non-volatile storage elements of the NAND string while the first select gate remains on, preventing boosting of the NAND string while applying the one or more read pass voltages, applying a charge to a bit line for the NAND string, turning on a second select gate after applying the charge, and sensing the bit line. In one implementation, the preventing boosting includes the second select gate being on while applying of one or more read pass voltages and subsequently turning off the second select gate prior to applying the charge. In another implementation, the preventing boosting includes applying one of the one or more read pass voltages as a control gate voltage to a selected non-volatile storage element of the NAND string while applying the one or more read pass voltages to the unselected non-volatile storage elements of the NAND string and subsequently lowering the control gate voltage to a read compare voltage prior to the turning on of the second select gate.

In one example implementation, a non-volatile storage system includes a plurality of non-volatile storage elements and one or more managing circuits in communication with the non-volatile storage elements. The one or more managing circuits establish read conditions for unselected non-volatile storage elements and prevent boosting of the non-volatile storage elements while setting up the read conditions. The one or more managing circuits sense data for at least one selected non-volatile storage elements based on the read conditions.

BRIEF DESCRIPTION OF THE DRAWINGS

FIG. 13 is a flow chart describing one embodiment of a process for reading non-volatile memory.
FIG. 14 is a signal diagram that depicts one embodiment of a process used when reading non-volatile memory.
FIG. 15 is a signal diagram that depicts one embodiment of a process used when reading non-volatile memory.

DETAILED DESCRIPTION

Figure 1:
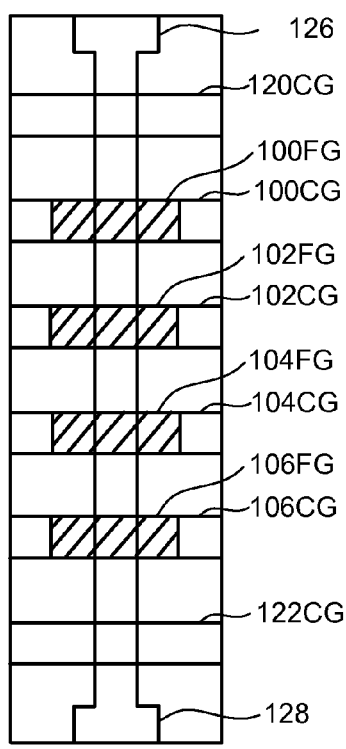
FIG. 1 is a top view of a NAND string.
Figure 2:
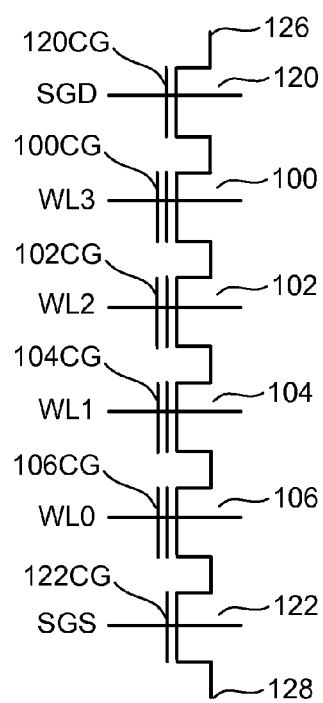
FIG. 2 is an equivalent circuit diagram of the NAND string.
Figure 3:
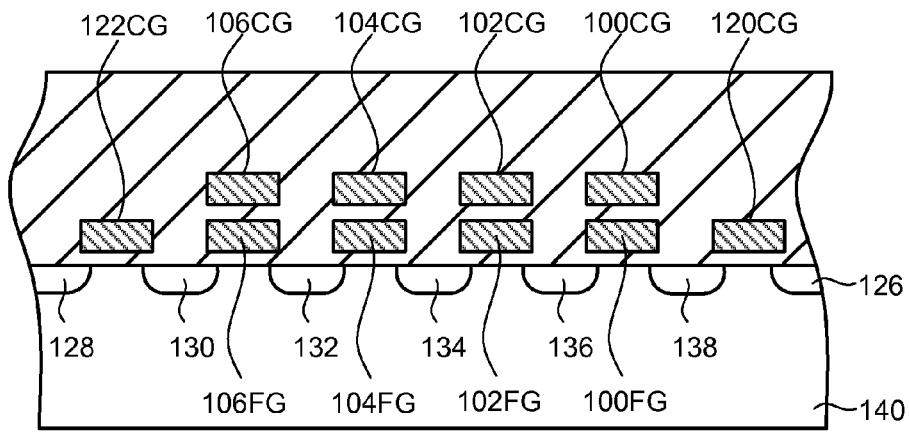
FIG. 3 is a cross-sectional view of the NAND string.
Figure 4:
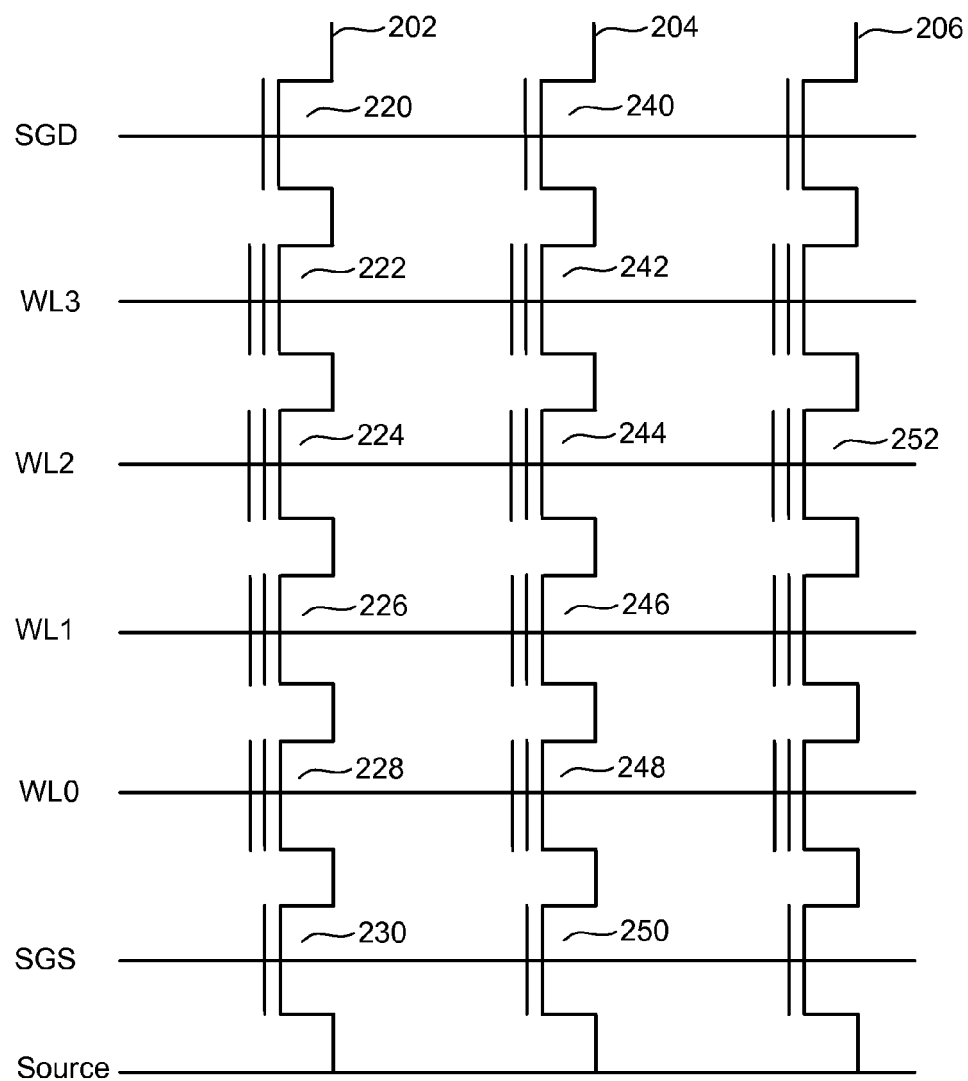
FIG. 4 depicts a set of NAND strings.
Figure 5:
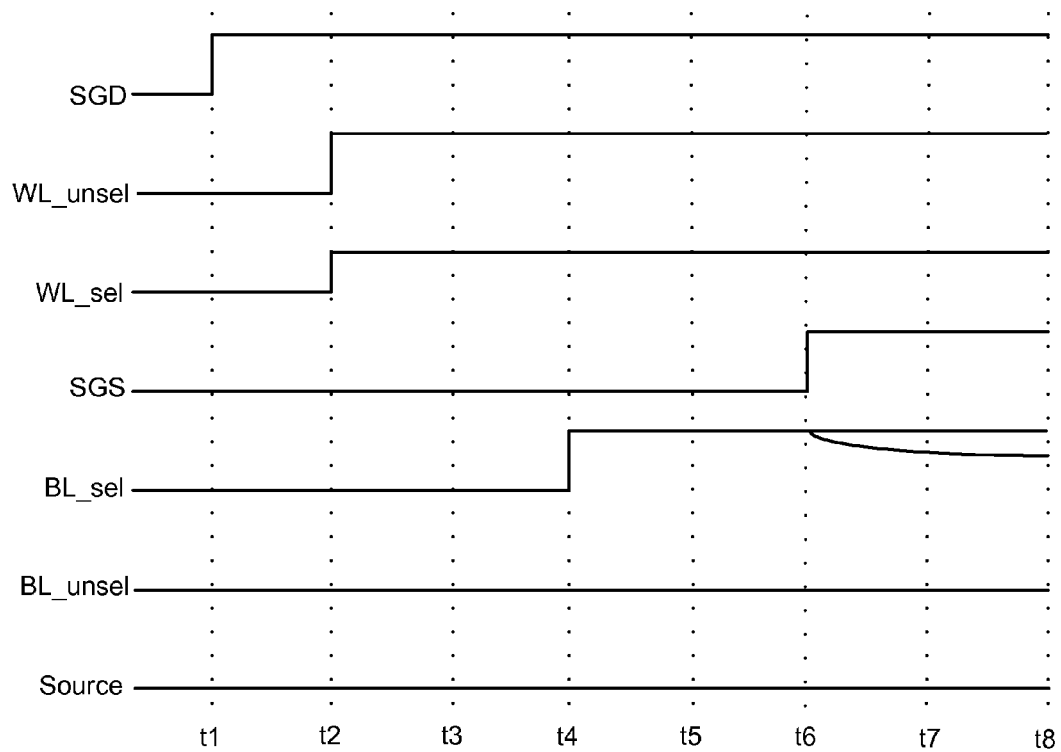
FIG. 5 is a signal diagram of a process used when reading non-volatile memory.
Figure 6:
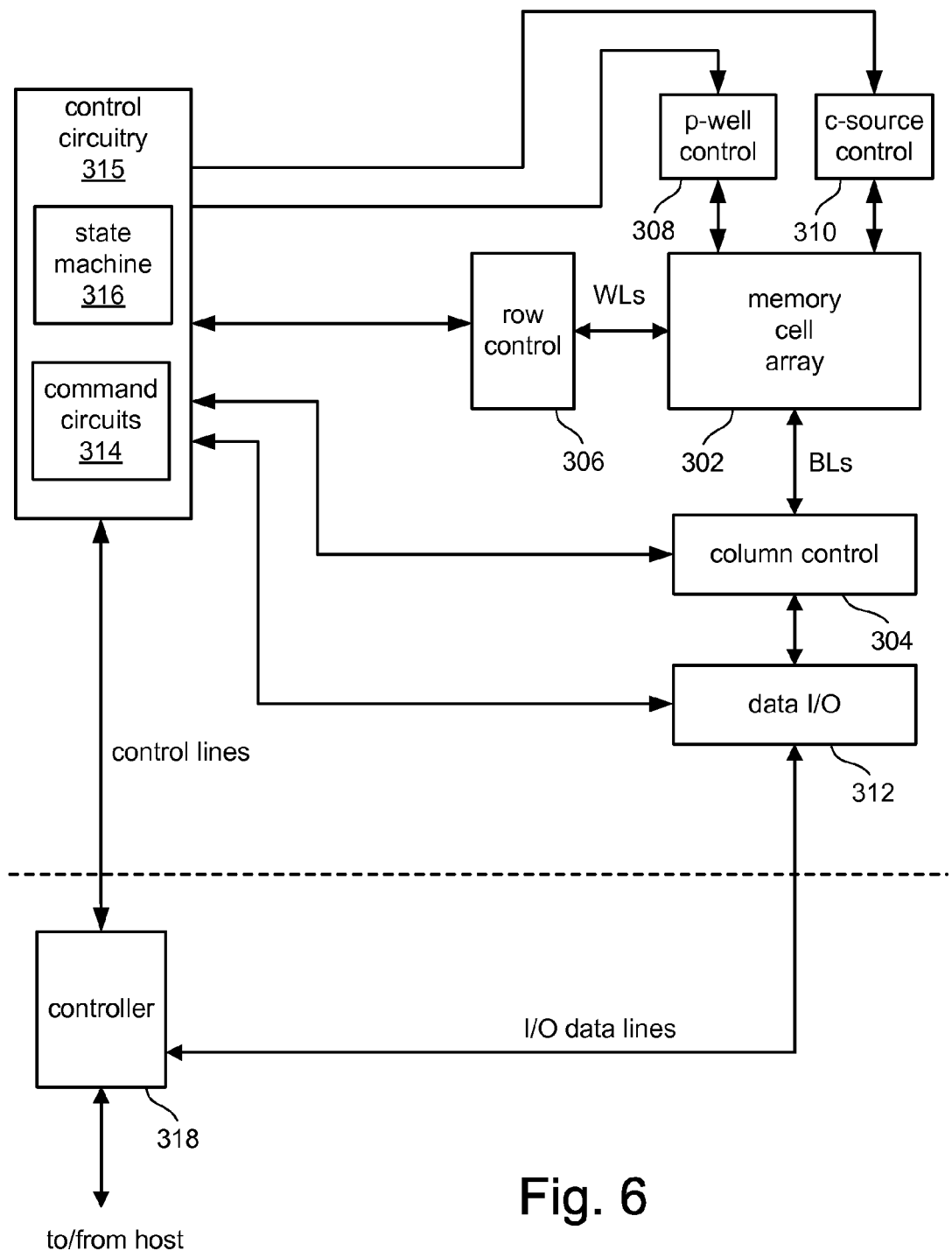
FIG. 6 is a block diagram of a non-volatile memory system.

FIG. 6 is a block diagram of one embodiment of a flash memory system that can implement the technology described herein for reducing or removing Read Disturb in a storage device. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, and to apply program voltages. C-source control circuit 310 controls a common source line (labeled as "source" in FIG. 7) connected to the memory cells. P-well control circuit 308 controls the p-well voltage and can provide the erase voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316 which is part of control circuitry 315. State machine 316 controls column control circuit 304, row control circuit 306, c-source control 310, p-well control circuit 308 and data input/output buffer 312. State machine 316 can also output status data of the flash memory such as READY/BUSY or PASS/FAIL. In some embodiments, state machine 316 is responsible for managing the programming process, verify process and the read process, including the processes depicted in the flow charts described below.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314 which are part of control circuitry 315. Command circuits 314 are in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

In some implementations, some of the components of FIG. 6 can be combined. In various designs, one or more of the components of FIG. 6 (alone or in combination), other than memory cell array 302, can be thought of as a managing circuit. For example, one or more managing circuits may include any one of or a combination of a command circuit, a state machine, a row control circuit, a column control circuit, a well control circuit, a source control circuit or a data I/O circuit.

In one embodiment, memory cell array 302 includes NAND flash memory. In other embodiments, other types of flash memory and/or other types of non-volatile storage can be used, including those described above as well as others not described above.

Figure 7:
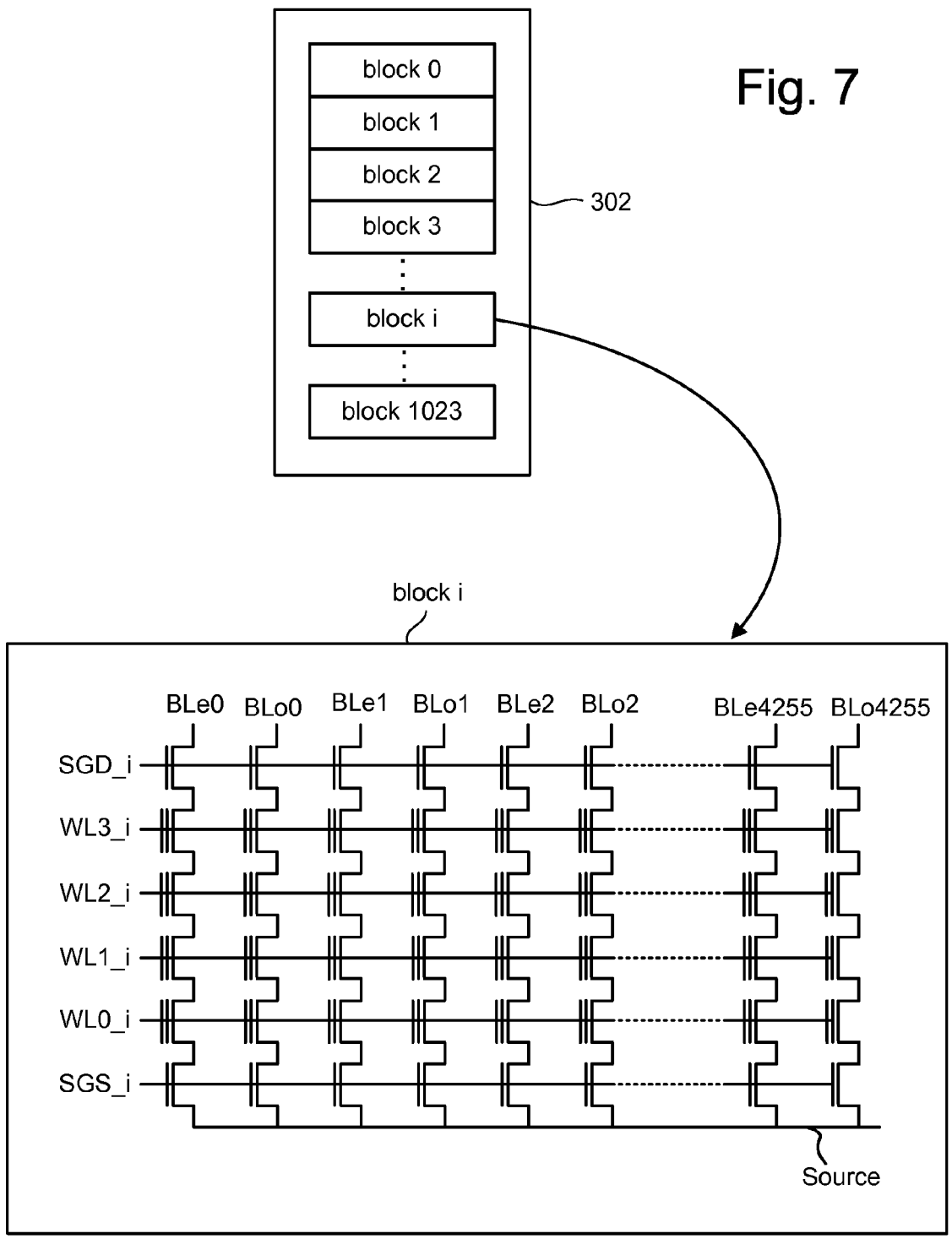
FIG. 7 is a block diagram of a non-volatile memory array.

With reference to FIG. 7, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 7 shows four memory cells connected in series to form a NAND string. Although four cells are shown to be included in each NAND string, more or less than four memory cells can be used. One terminal of the NAND string is connected to corresponding bit line via a select transistor SGD, and another terminal is connected to c-source via a second select transistor SGS.

During one embodiment of read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g., multi-state memory cells), wherein each of these two bits are stored in a different page, one block stores 16 logical pages. Other sized blocks and pages can also be used with the present invention. Additionally, architectures other than that of FIGS. 6 and 7 can also be used to implement the present invention. For example, in one embodiment the bit lines are not divided into odd and even bit lines so that all bit lines are programmed and read concurrently (or not concurrently).

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative (in one embodiment).

As described above, each block can be divided into a number of pages. In one embodiment, a page is a unit of programming. In some implementations, the individual pages may be divided into segments and the segments may contain the fewest number of cells that are written at one time as a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller calculates the ECC when data is being programmed into the array, and also checks it when data is being read from the array. Alternatively, the ECCs and/or other overhead data are stored in different pages, or even different blocks, than the user data to which they pertain. In other embodiments, other parts of the memory device (e.g., state machine) can calculate the ECC.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages.

Figure 8:
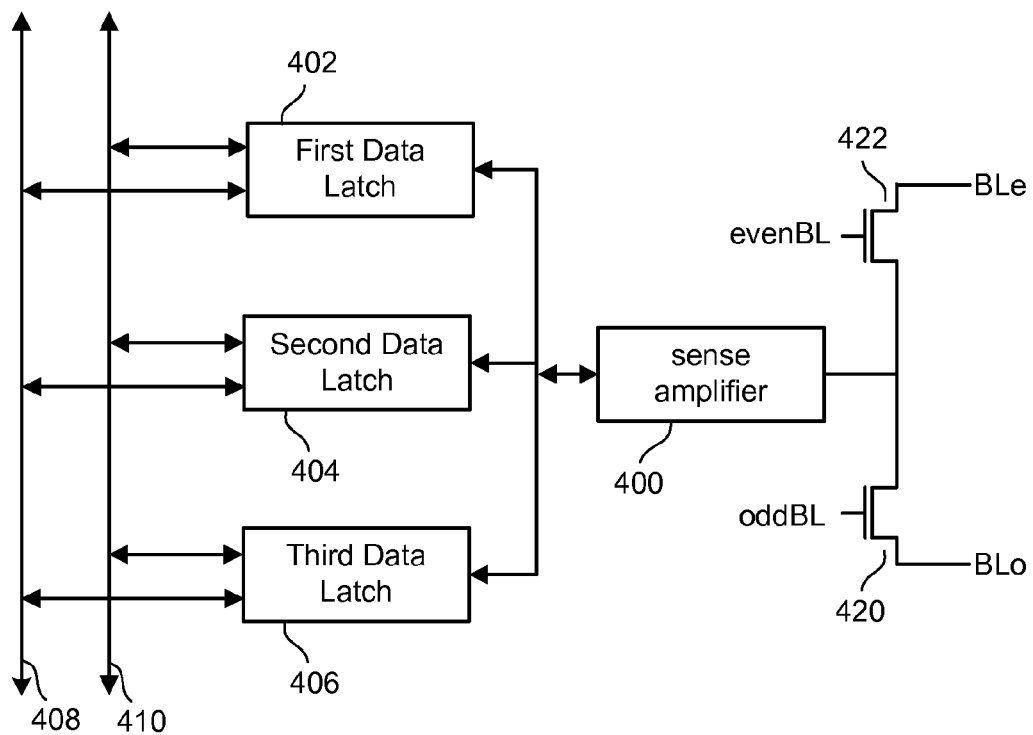
FIG. 8 is a block diagram depicting a sense amplifier and latches.

During a read or verify operation, the state of a memory cell is detected by a sense amplifier that is connected to the bit line. FIG. 8 depicts a portion of column control circuit 304 of FIG. 6 that includes a sense amplifier. Each pair of bit lines (e.g. BLe and BLo) is coupled to a sense amplifier 400. The sense amplifier is connected to three data latches: first data latch 402, second data latch 404 and third data latch 406. Each of the three data latches is capable of storing one bit of data. The sense amplifier senses the potential level of the selected bit line during read or verify operations, stores the sensed data in a binary manner, and controls the bit line voltage during the program operation. The sense amplifier is selectively connected to the selected bit line by selecting one of signals of "evenBL" and "oddBL." Data latches 402, 404 and 406 are coupled to I/O lines 408 to output read data and to store program data. I/O lines 408 are connected to data input/output buffer 312 of FIG. 6. Data latches 402, 404 and 406 are also coupled to status line(s) 410 to receive and send status information. In one embodiment, there is a sense amplifier, first data latch 402, second data latch 404 and third data latch 406 for each pair (even and odd) of bit lines.

Figure 9:
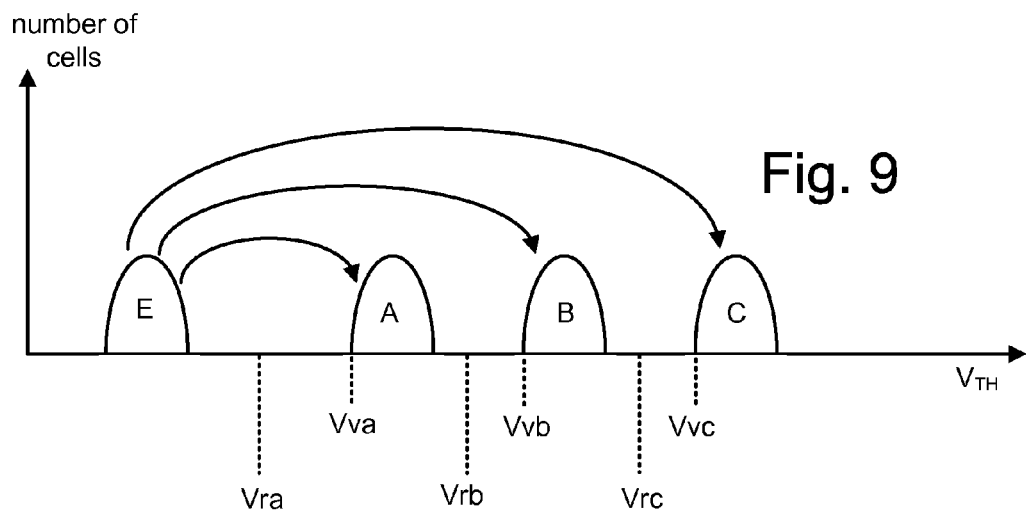
FIG. 9 depicts an example set of threshold voltage distributions.

FIG. 9 illustrates threshold voltage distributions for the memory cell array when each memory cell stores two bits of data. FIG. 9 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 9 corresponds to predetermined values for the set of data bits. The specific relationship between the data programmed into the memory cell and the threshold voltage levels of the cell depends upon the data encoding scheme adopted for the cells. One example assigns "11" to threshold voltage range E (state E), "10" to threshold voltage range A (state A), "00" to threshold voltage range B (state B) and "01" to threshold voltage range C (state C). However, in other embodiments, other schemes are used.

FIG. 9 also shows three read reference voltages, Vra, Vrb and Vrc, for reading data from memory cells. By testing whether the threshold voltage of a given memory cell is above or below Vra, Vrb and Vrc, the system can determine what state the memory cell is in. For example, if a memory cell turns on when Vra, Vrb and Vrc are applied to its control gate, then the memory cell is in state E. If a memory cell turns on when Vrb and Vrc are applied to its control gate, but not when Vra is applied to its control gate, then the memory cell is in state A. If a memory cell turns on when Vrc is applied to its control gate, but not when Vra or Vrb are applied to its control gate, then the memory cell is in state B. If the memory cell does not turn on in response to Vra, Vrb or Vrc being applied to its control gate, then the memory cell is in state C.

FIG. 9 also shows three verify reference voltages, Vva, Vvb and Vvc. When programming memory cells to state A, the system will test whether those memory cells have a threshold voltage greater than or equal to Vva. A memory cell being programmed to state A will continue being programmed until its threshold voltage is at or above Vva. When programming memory cells to state B, the system will test whether the memory cells have threshold voltages greater than or equal to Vvb. A memory cell being programmed to state B will continue being programmed until its threshold voltage is at or above Vvb. When programming memory cells to state C, the system will determine whether memory cells have their threshold voltage greater than or equal to Vvc. A memory cell being programmed to state C will continue being programmed until its threshold voltage is at or above Vvc.

In one embodiment, known as full sequence programming, memory cells can be programmed from the erased state E directly to any of the programmed states A, B or C (as depicted by the curved arrows). For example, a population of memory cells to be programmed may first be erased so that all memory cells in the population are in erased state E. While some memory cells are being programmed from state E to state A, other memory cells are being programmed from state E to state B and/or from state E to state C.

Figure 10:
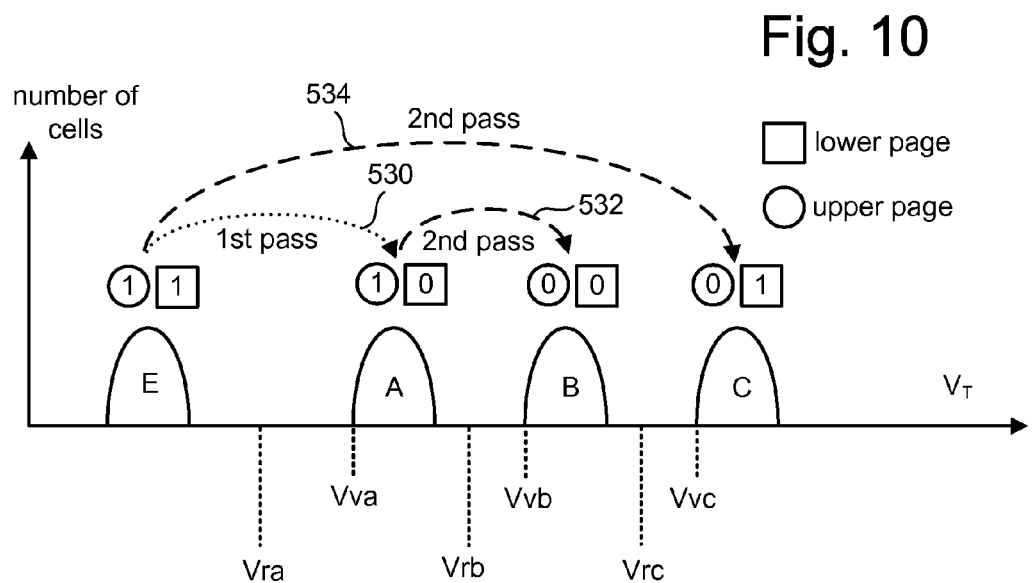
FIG. 10 depicts an example set of threshold voltage distributions.

FIG. 10 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the memory cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 530. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 534. If the cell had been programmed into state A as a result of the first programming pass, then the memory cell is further programmed in the second pass so that the threshold voltage is increased to be within state B, as depicted by arrow 532. The result of the second pass is to program the cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Figure 11A:
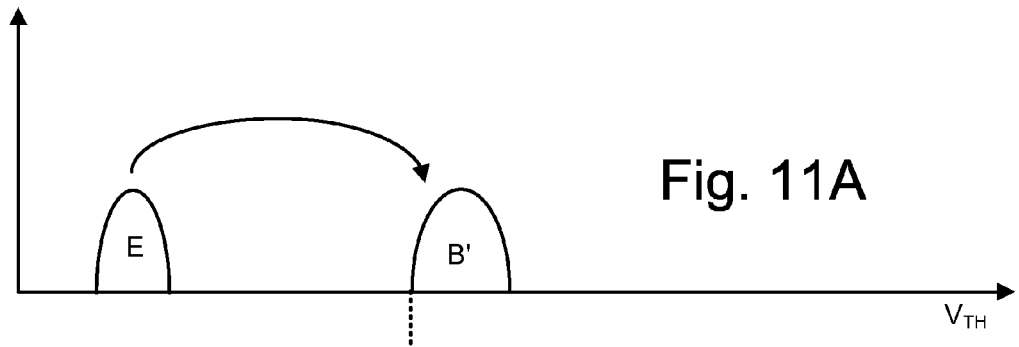
FIGS. 11A-C show various threshold voltage distributions and describe a process for programming non-volatile memory.
Figure 11B:
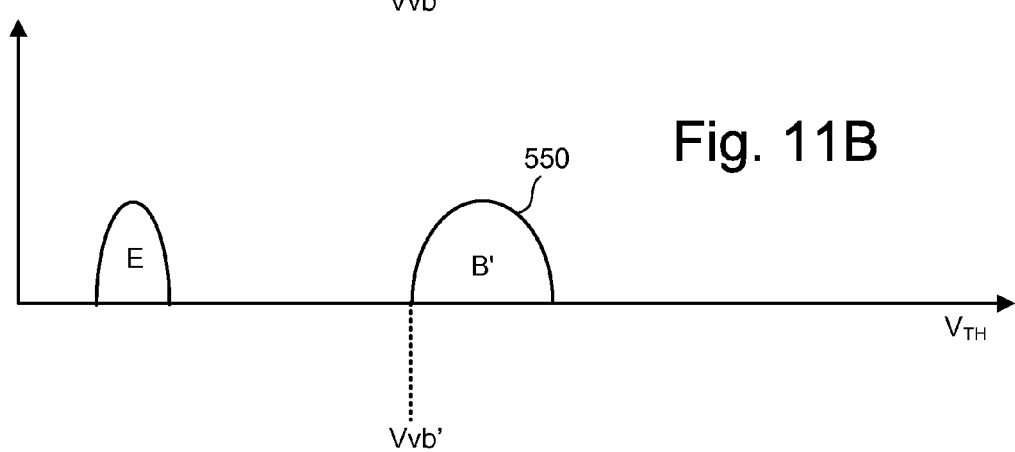
Figure 11C:
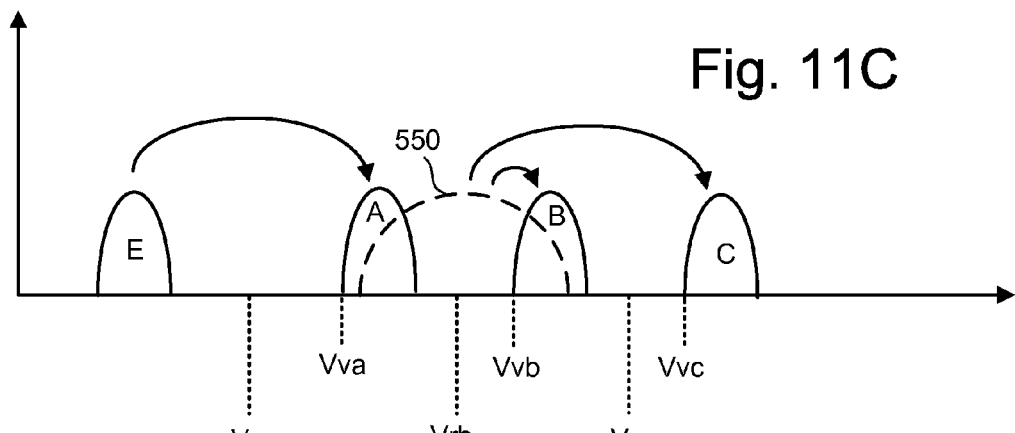

FIGS. 11A-C disclose another process for programming non-volatile memory that reduces floating gate to floating gate coupling by, for any particular memory cell, writing to that particular memory cell with respect to a particular page subsequent to writing to adjacent memory cells for previous pages. In one example of an implementation of the process taught by FIGS. 11A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIG. 11, the upper page stores bit 0 and the lower page stores bit 1. With reference to state B, the upper page stores bit 1 and the lower page stores bit 0. With reference to state C, both pages store bit data 0.

The programming process of FIGS. 11A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 11A therefore shows the programming of memory cells from state E to state B'. State B' depicted in FIG. 11A is an interim state B; therefore, the verify point is depicted as Vvb', which is lower than Vvb.

In one embodiment, after a memory cell is programmed from state E to state B', its neighbor memory cell on an adjacent word line will then be programmed with respect to its lower page. After programming the neighbor memory cell, the floating gate to floating gate coupling effect will raise the apparent threshold voltage of memory cell under consideration, which is in state B'. This will have the effect of widening the threshold voltage distribution for state B' to that depicted as threshold voltage distribution 550 of FIG. 11B. This apparent widening of the threshold voltage distribution will be remedied when programming the upper page.

FIG. 11C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 550 and the upper page data is to remain at 1, then the memory cell will be programmed to final state B. If the memory cell is in intermediate threshold voltage distribution 550 and the upper page data is to become data 0, then the threshold voltage of the memory cell will be raised so that the memory cell is in state C.

The process depicted by FIGS. 11A-C reduces the effect of floating gate to floating gate coupling because only the upper page programming of neighbor memory cells will have an effect on the apparent threshold voltage of a given memory cell. An example of an alternate state coding is to move from distribution 550 to state C when the upper page data is a 1, and to move to state B when the upper page data is a 0. Although FIGS. 11A-C provide an example with respect to four data states and two pages of data, the concepts taught by FIGS. 11A-C can be applied to other implementations with more or less than four states and different than two pages. More detail about various programming schemes can be found in U.S. Pat. No. 6,657,891, issued on Dec. 2, 2003 to Shibata et al., which are incorporated herein by reference in their entirety.

Figure 12:
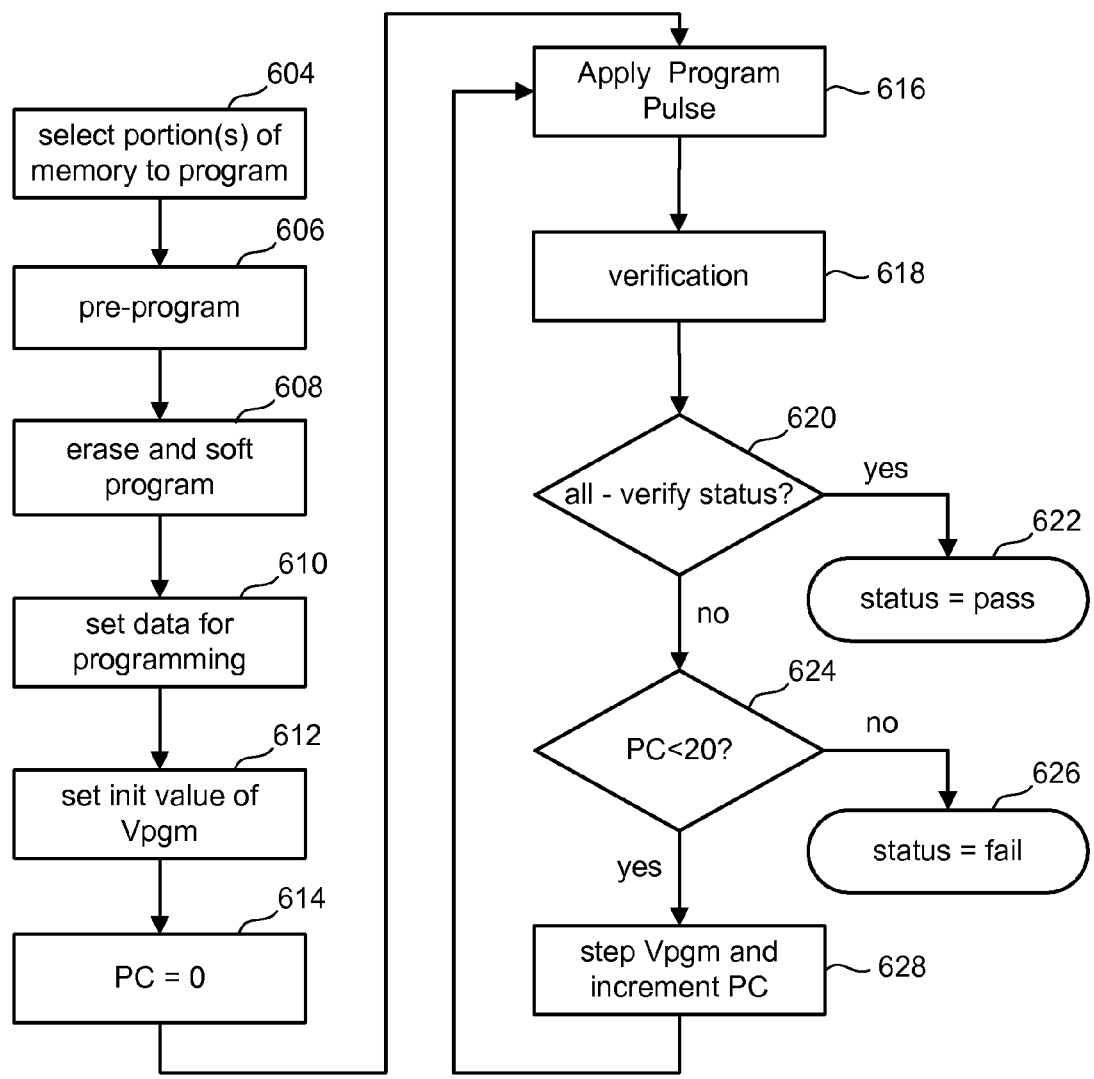
FIG. 12 is a flow chart describing one embodiment of a process for programming non-volatile memory.

FIG. 12 is a flow chart describing one embodiment of a high level process for programming. A request to program data can be received at the controller, the state machine, or another device. In response to that request, data (one or more bits of information) is written to the flash memory array 302 according to the process of FIG. 12. In step 604 of FIG. 12, the system will select the appropriate portions of memory to program. This may include selecting a block and/or page and/or sector to write to. In one embodiment, the process of FIG. 12 writes data to a page, which includes writing data to memory cells connected to a common word line. In step 606, the selected portion of memory is pre-programmed, which provides for even wearing of the flash memory. All memory cells in the chosen sector or page are programmed to the same threshold voltage range. Step 606 is an optional step. In step 608, the memory cells to be programmed are then erased. For example, step 608 can include moving all memory cells to state E (see FIG. 9-11). In some embodiments, step 608 also includes performing a soft programming process. During the erase process, it is possible that some of the memory cells have their threshold voltages lowered to a value that is below the distribution E (see FIG. 9-11). The soft programming process will apply program voltage pulses to memory cells so that their threshold voltages will increase to be within threshold voltage distribution E.

In step 610, data to be programmed is stored in the appropriate latches/registers. In one embodiment, the process of FIG. 12 will be used to program one page of data. All of the memory cells being programmed are on the same word line. Each memory cell will have its own bit line and a set of latches associated with that bit line. These latches will store indications of the data to be programmed for the associated memory cell. In step 612, the magnitude of the first program pulse is set. In some embodiments, the voltage applied to the word lines during the programming process is a set of program pulses, with each pulse increasing in magnitude from the previous pulse by a step size (e.g., 0.2v-0.4v). In step 614, the program count (PC) will be set to initially be zero.

In step 616, a program pulse is applied to the appropriate word line(s). In step 618, the memory cells on that word line(s) are verified to see if they have reached the target threshold voltage level. If all the memory cells have reached the target threshold voltage level (step 620), then the programming process has completed successfully (status=pass) in step 622. If not all the memory cells have been verified, then it is determined in step 624 whether the program count PC is less than 20 (or another suitable value). If the program count is not less than 20, then the programming process has failed (step 626). If the program count is less than 20, than in step 628, the magnitude of program voltage signal Vpgm is incremented by the step size (e.g. 0.3v) for the next pulse and the program count PC is incremented. Note that those memory cells that have reached their target threshold voltage are locked out of programming for the remainder of the current programming cycle. After step 628, the process of FIG. 12 continues at step 616 and the next program pulse is applied.

FIG. 13 is a flow chart describing one embodiment of a process for reading data that has been programmed. A request to read data can be received at the controller, the state machine, or another device. In response to that request, data (one or more bits of information) is read from the flash memory array 302 according to the process of FIG. 13. In step 702, the request to read data is received. This request will include an identification of the data to be read. This identification is used to determine which memory cells in array 302 to read in step 704. In step 706, the appropriate conditions are established on the appropriate bit lines and word lines to enable the data to be read. More details of step 706 will be described below with respect to FIGS. 14 and 15. In step 708, data from the selected memory cells is sensed using one or more sense amplifiers. If the memory cells are operating with two states (erased and programmed), then steps 706 and 708 are only performed once each. If the memory cells are multi-state memory cells, then steps 706 and 708 are performed multiple times (e.g., once for each read/verify compare value). For example, if there are four states (e.g., states E, A, B and C of FIG. 9), then steps 706 and 708 are performed once for Vra, once for Vrb and once for Vrc. In step 710, the data stored is determined. If the memory cell stores data in two states, then the data directly corresponds to whether the memory cell turned on in response to the read conditions. If the memory cells stores data in multiple states and steps 706 and 708 were performed multiple times, then step 710 includes determining the data based on the various iterations of steps 706 and 708. In step 712, the data is reported to the state machine, controller and/or host device.

FIG. 14 is a timing diagram that describes the behavior of various signals during one embodiment of the read process. The behavior depicted in FIG. 14 occurs during one embodiment of steps 706 and 708 of FIG. 13. In one embodiment, the process described by the timing diagram of FIG. 14 is not used for verification during programming. Instead, previously used read process can be used for verification. However, in some embodiments, the timing diagram of FIG. 14 also applies to the verification process performed during programming.

All of the signals depicted in FIG. 14 start at 0 volts (or near 0 volts). The unselected bit lines BL_unsel and the source line (Source) remain at 0 volts during the time period depicted in FIG. 14. SGD (control gate voltage of the drain side select gate) goes high (e.g., 1.5 to 4.5 volts) at time t1 and stays at that voltage during the time period depicted in FIG. 14. At time t1, SGS (the control gate of the source side select gate) goes high (e.g., 1.5 to 4.5 volts) and remains high until time t3. At time t2, the unselected word lines W_unsel are ramped up to Vread (the read pass voltage—e.g., ~5 volts) and the selected word line WL_sel is ramped up to the appropriate read/verify compare voltage (e.g., Vra, Vrb, Vrc, Vva, Vvb or Vvc) to establish the read conditions. Because the drain side select gate is on and the selected bit line (BL_sel) is at ground, the channel on the drain side of the NAND string (with respect to the selected memory cell) does not boost because the charge can be dissipated via the bit line. Because the source side select gate is on and the source line is at ground, the channel on the source side of the NAND string (with respect to the selected memory cell) does not boost because the charge can be dissipated via the source line. Because there is no boosting, there is no hot electron injection that can cause Read Disturb. After the word lines have ramped up and reached a steady state, the source side select gate (SGS) can be turned off at time t3. This is because boosting of the channel will typically only occur while the word lines are being ramped up. Note that in some embodiments, different unselected word lines could receive different read pass voltages.

At time t4, the selected bit lines BL_sel, which in one embodiment could be all of the even bit lines or all of the odd bit lines (but in other embodiments other subsets can be selected or all bit lines can be selected), are pre-charged. In one example, the selected bit lines are pre-charged to 0.7 volts. Other values for a pre-charge voltage can also be used. At time t6, SGS is raised (e.g., 1.4 to 4.5 volts). If the voltage applied to the selected word line WL_sel is less than the threshold voltage of the memory cell, then the memory cell will not turn on and current will not flow in the channel. As a result, the bit line voltage will be maintained at the pre-charged level, as depicted by line 802. If the voltage applied to the selected word line WL_sel is greater than the threshold voltage of the memory cell, then the memory cell will turn on and allow current to flow in the channel. As a result, the bit line voltage will begin to dissipate, as depicted by line 804. A sense amplifier can be used to determine whether the bit line voltage dissipated. One example set of timing values include t1=0.0 usec, t2=0.3 usec, t3=3.3 usec, t4=4.8 usec, and t6=12.0 usec.

FIG. 15 is a timing diagram that describes the behavior of various signals during another embodiment of the read process. The behavior depicted in FIG. 15 occurs during another embodiment of steps 706 and 708 of FIG. 13. The timing diagram of FIG. 15 also applies to the verification process during programming. All of the signals start at 0 volts (or near 0 volts). The unselected bit lines BL_unsel and the source line remain at 0 volts during the time period depicted in FIG. 15. SGD (control gate voltage of the drain side select gate) goes high (e.g., 1.5 to 4.5 volts) at time t1 and stays at that voltage during the time period depicted in FIG. 15. At time t2, the unselected word lines WL_unsel and the selected word line WL_sel are ramped up to the read pass voltage Vread (e.g., 5 volts). Because the selected word line WL_sel is ramped to Vread and Vread is higher than any of the threshold voltages for the selected memory cells, then during the ramping up of the word lines the selected memory cell will turn on at some point and prevent/dissipate any boosting of the channel of the NAND string. Because there is no boosting, there is no hot electron injection that can cause Read Disturb. After the word lines have ramped up to Vread and reached a steady state, then the selected word line WL_sel is lowered to the appropriate read/verify compare voltage (e.g., Vra, Vrb, Vrc, Vva, Vvb or Vvc) at time t3.

In one embodiment, when the selected word line WL is ramped up to a voltage at time t2 (concurrently with the unselected word lines WL_unsel being ramped up to the read pass voltage), the selected word line WL can be ramped up to a different voltage than the voltage applied to the unselected word lines WL_unsel. For example, the unselected word lines WL_unsel can be ramped up to the read pass voltage while the selected word line WL can be ramped up to a voltage that is higher or lower than the read pass voltage.

At time t4, the selected bit lines, which in one embodiment could be all of the even bit lines or all of the odd bit lines (but in other embodiments, other subsets can be selected or all bit lines can be selected), are pre-charged. In one example, the selected bit lines are pre-charged to 0.7 volts. At time t6, SGS is raised to 1.5 to 4.5 volts. If the voltage applied to the selected word line WL_sel is less than the threshold voltage of the memory cell, then the memory cell will not turn on and current will not flow in the channel. As a result, the bit line voltage will be maintained at the pre-charged level, as depicted by line 812. If the voltage applied to the selected word line WL_sel is greater than the threshold voltage of the memory cell, then the memory cell will turn on and allow current to flow in the channel. As a result, the bit line voltage will begin to dissipate, as depicted by line 814. A sense amplifier can be used to determine whether the bit line voltage dissipated.

Note that FIGS. 14 and 15 show the transitions of the signals as ideal transitions with straight lines. However, many of the transitions are non-linear (e.g., not a straight line). For example, a dotted oval is used to highlight the unselected word lines WL_unsel ramping up to Vread and the selected word line WL_sel ramping up to Vread and then back down to the appropriate read/verify compare voltage (e.g., Vra, Vrb, Vrc, Vva, Vvb or Vvc). As can be seen, the signals are curves.

In the above described implementations, the source side select gate was used to trigger the sensing process. If an implementation uses a drain side select gate to trigger the sensing process, the above described solution of FIG. 15 would also apply. The solution of FIG. 14 can also apply, with the change that the drain side select gate would be on for the period of time that the word lines are ramped to Vread, then the drain side select gate is turned off for the pre-charging, followed by turning the drain side select gate back on after pre-charging.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A method for reading from non-volatile memory, comprising:
    turning on a first select gate and a second select gate for a set of non-volatile storage elements;
    applying one or more read voltages to at least a subset of said non-volatile storage elements while said first select gate and said second select gate remain on;
    turning off said second select gate;
    applying a charge to said non-volatile storage elements;
    turning on said second select gate; and
    sensing whether there is a change to said charge.

2. A method according to claim 1, wherein:
    said one or more read voltages are one or more read pass voltages; and
    said method further comprises applying a read compare voltage to a selected non-volatile storage element while said first select gate and said second select gate remain on.

3. A method according to claim 2, wherein:
    said set of non-volatile storage elements are part of a NAND string;
    said first select gate is a drain side select gate for said NAND string; and
    said second select gate is a source side select gate for said NAND string.

4. A method according to claim 3, wherein:
    said set of non-volatile storage elements are multi-state flash memory devices.

5. A method according to claim 4, wherein:
    said turning on a first select gate and a second select gate, applying one or more read voltages, turning off said second select gate, applying a charge, turning on said second select gate, and sensing are repeated for different states of said multi-state flash memory devices.

6. A method according to claim 1, further comprising:
    receiving a request to read data; and
    reporting said data based on said sensing;

said turning on a first select gate and a second select gate, applying one or more read voltages, turning off said second select gate, applying a charge, turning on said second select gate, and sensing are performed in response to said request.

7. A method according to claim 1, further comprising:
receiving a request to program data;
programming said data; and
verifying said data during said programming;
said turning on a first select gate and a second select gate, applying one or more read voltages, turning off said second select gate, applying a charge, turning on said second select gate, and sensing are performed as part of said verifying.

8. A method for reading from non-volatile memory, comprising:
turning on a first select gate and a second select gate associated with a NAND string of non-volatile storage elements;
applying one or more read pass voltages to unselected non-volatile storage elements of said NAND string while said first select gate and said second select gate remain on;
applying a read compare voltage to a selected non-volatile storage element while said first select gate and said second select gate remain on;
turning off said second select gate after said one or more read pass voltages and said read compare voltage have reached steady state values;
applying a charge to a bit line of said NAND string;
turning on said second select gate after applying said charge; and
sensing said bit line to determine if there is a change to said charge.

9. A method according to claim 8, wherein:
said first select gate is a source side select gate for said NAND string; and
said second select gate is a drain side select gate for said NAND string.

10. A method according to claim 8, wherein:
said first select gate is a drain side select gate for said NAND string; and
said second select gate is a source side select gate for said NAND string.

11. A method according to claim 8, wherein:
said set of non-volatile storage elements are multi-state flash memory devices.

12. A method according to claim 11, wherein:
said turning on a first select gate and a second select gate, applying one or more read pass voltages, applying a read compare voltage, turning off said second select gate, applying a charge, turning on a second select gate, and sensing are repeated for different states of said multi-state flash memory devices.

13. A method according to claim 8, wherein said applying one or more read pass voltages to unselected non-volatile storage elements includes:
applying different read pass voltages to different ones of the unselected non-volatile storage elements.

14. A method for reading from non-volatile memory, comprising:
turning on a first select gate and a second select gate associated with a NAND string of non-volatile storage elements;
applying one or more voltages to unselected non-volatile storage elements of said NAND string while said first select gate and said second select gate remain on, said one or more voltages sufficient to turn on said unselected non-volatile storage elements;
applying a read compare voltage to a selected non-volatile storage element while said first select gate and said second select gate remain on;
turning off said second select gate after said one or more voltages and said read compare voltage have reached steady state values;
applying a charge to a bit line of said NAND string;
turning on said second select gate after applying said charge; and
sensing whether there is a change to said charge.

15. A method according to claim 14, wherein:
said first select gate is a source side select gate for said NAND string; and
said second select gate is a drain side select gate for said NAND string.

16. A method according to claim 14, wherein:
said first select gate is a drain side select gate for said NAND string; and
said second select gate is a source side select gate for said NAND string.

17. A method according to claim 14, wherein:
said NAND string of non-volatile storage elements are multi-state flash memory devices.

18. A method according to claim 17, wherein:
said turning on a first select gate and a second select gate, applying one or more voltages, applying a read compare voltage, turning off said second select gate, applying a charge, turning on a second select gate, and sensing are repeated for different states of said multi-state flash memory devices.

19. A method according to claim 14, further comprising:
receiving a request to read data; and
reporting said data based on said sensing;
said turning on a first select gate and a second select gate, applying one or more voltages, applying a read compare voltage, turning off said second select gate, applying a charge, turning on a second select gate, and sensing are performed in response to said request.

20. A method according to claim 14, further comprising:
receiving a request to program data;
programming said data; and
verifying said data during said programming;
said turning on a first select gate and a second select gate, applying one or more voltages, applying a read compare voltage, turning off said second select gate, applying a charge, turning on a second select gate, and sensing are performed as part of said verifying.

* * * * *